United States Patent [19]

Pfab

[11] 3,885,218

[45] May 20, 1975

[54] SUPERHETERODYNE RECEIVER HAVING A DIGITAL INDICATION OF THE RECEIVED FREQUENCY

[75] Inventor: Diethard Pfab, Munich, Germany

[73] Assignee: Siemens Aktiengesellschaft, Berlin & Munich, Germany

[22] Filed: Apr. 6, 1973

[21] Appl. No.: 348,684

[30] Foreign Application Priority Data

Apr. 10, 1972 Germany ........................... 2217210

[52] U.S. Cl. .............. 325/455; 324/78 D; 325/364; 331/64

[51] Int. Cl. ........................ H04b 1/16; G01r 23/10

[58] Field of Search ............ 325/67, 363, 364, 452, 325/455; 331/64; 324/78 D, 79 R, 79 D

[56] References Cited

UNITED STATES PATENTS

| | | | |
|---|---|---|---|
| 3,244,983 | 4/1966 | Ertman | 325/455 |
| 3,681,707 | 8/1972 | Bean | 325/455 |
| 3,701,951 | 10/1972 | Krausser | 325/455 |
| 3,758,853 | 9/1973 | Dionne et al. | 325/455 |

*Primary Examiner*—Robert L. Griffin
*Assistant Examiner*—Marc E. Bookbinder
*Attorney, Agent, or Firm*—Hill, Gross, Simpson, Van Santen, Steadman, Chiara & Simpson

[57] ABSTRACT

A superheterodyne receiver having a digital indication of the received frequency wherein a multi-stage counter serves for measuring the oscillations of a local oscillator by taking into consideration the frequency shift of its local oscillator frequency with respect to the received frequency. A correction circuit is controlled from the output of a counter stage to block the following counter stages during the occurrence of a number of output pulses of the first mentioned counter stage, which number is in proportion to the frequency offset.

8 Claims, 3 Drawing Figures

Fig. 3

SUPERHETERODYNE RECEIVER HAVING A DIGITAL INDICATION OF THE RECEIVED FREQUENCY

BACKGROUND OF THE INVENTION

1. Field of the Invention

This invention relates to a superheterodyne receiver having a digital indication of the received frequency, and more particularly to a superheterodyne receiver in which a multi-stage counter serves for counting the oscillations of a local oscillator, the received frequency value being derived from the count by taking into consideration the predetermined frequency offset of the local oscillator frequency with respect to the received frequency.

2. Description of the Prior Art

In a known superheterodyne receiver of the type mentioned above (German published application No. 1,190,522) the frequency offset of the measured local oscillator frequency with respect to the received frequency is taken into consideration by a corresponding initial position of a counter. The position is chosen in such a way that the counted result which is achieved after termination of the counting process directly states the value of the received frequency. The technical measures which are required for the arrangement in switching the counter to the initial position can, however, become quite complicated, depending on the value of the frequency offset.

SUMMARY OF THE INVENTION

The primary object of the present invention is, therefore, to provide a superheterodyne receiver of the type initially mentioned in which a prescribed offset of the local oscillator frequency with respect to the receiving frequency is taken into consideration during the counting process in a particularly simple manner.

According to the invention, the foregoing object is achieved through the provision of a correction circuit which is controlled by the output of a counter stage which either blocks the following counter stages during the occurrence of a number of transmission pulses from the first mentioned counter stage, which is in proportion to the frequency offset, through the application of a blocking signal, or which directs to the counter stages after the occurrence of the first transmission pulse a corresponding number of additionally created counter pulses to the input of the following counter stages.

A particular advantage which can be achieved with the invention is to be found in that, for the consideration of the prescribed frequency offset, one must only be concerned with the correction circuit which can be separated from the receiver circuit and not with the actual circuit of the frequency counter. By providing a minimum number of connection points between the correction circuit and the receiver circuit proper, the correction circuit may preferably be realized in a particularly easy manner as an extensible additional unit or, in integrated circuit technique, as an easily separable partial circuit. This design concept lends flexibility to the apparatus and provides for an easier exchangeability of the additional units which are adjusted to various values of frequency offset. In short, the correction circuits can be simply plugged in and out for selected frequency offsets.

BRIEF DESCRIPTION OF THE DRAWING

Other objects, features and advantages of the invention, its organization, construction and operation will be best understood from the following detailed description of preferred embodiments of the invention taken in conjunction with the accompanying drawing, on which.

DESCRIPTION OF THE PREFERRED EMBODIMENTS

Figures 1, 2, 3:
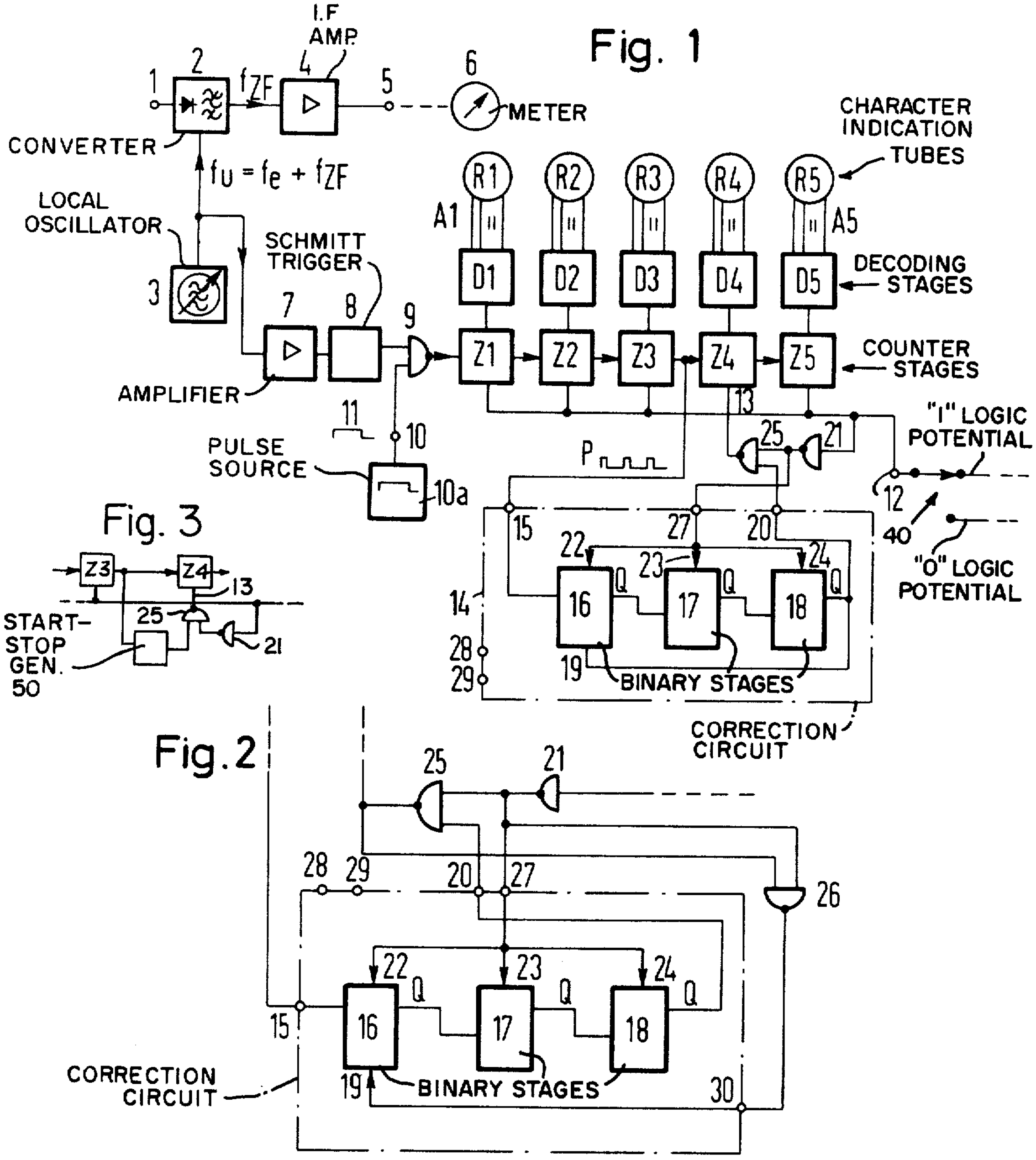
FIG. 1 is a schematic circuit diagram of a superheterodyne receiver which is designed according to the principles of the invention and which has a counter stage which can be blocked from time to time.
FIG. 2 is a schematic diagram of a circuit which can be employed in FIG. 1 in place of a similar circuit illustrated therein and having different resetting and blocking techniques.
FIG. 3 is a schematic representation of an alternative correction circuit for use in the receiver of FIG. 1.

FIG. 1 schematically illustrates a superheterodyne receiver in which parts which are not essential for the explanation of the invention have been omitted.

The superheterodyne receiver comprises a receiver input 1 which is followed by a frequency conversion stage 2 in which the received signal having a frequency $f_e$ or covering a frequency band centered around $f_e$ is respectively converted to an intermediate frequency $f_{ZF}$ or an intermediate frequency band centered around $f_{ZF}$. For this purpose, the conversion stage 2 contains a modulator to which a local oscillator frequency $f_u$ is provided from an adjustable local oscillator 3. The output of the modulator is applied to a band pass filter which selects the intermediate frequency and determines the transmission band width for the converted signals. These signals are amplified in an intermediate frequency amplifier 4 and are directed to subsequent circuit parts which are not individually illustrated by way of an intermediate frequency output 5. These non-illustrated circuit parts, in cases where the receiver is employed for measuring purposes may comprise, for example, a measuring rectifier and evaluation arrangements, and may include, in particular, a pointer type instrument or meter 6, or for purposes of information transmission, these parts may comprise apparatus for demodulation and low frequency stages, as is well known in the art.

In order to provide a digital indication of the respective receiving frequency $f_e$ to which the receiver is adjusted, the oscillations of the superheterodyne oscillator 3 are counted in a multistage counter Z1–Z5, whereby the direct counter result corresponding to the value of the frequency $f_u$ is at first corrected by the subtraction of an amount corresponding to the intermediate frequency $f_{ZF}$, assuming that $f_e = f_u - f_{ZF}$ and that only the corrected result is indicated. An addition of the aforementioned amount would be required for the case which is not given in the sample embodiment illustrated in FIG. 1, namely that the local oscillator frequency is subject to the equation $f_u = f_e - f_{ZF}$.

After passing through an amplifier 7, the output voltage of the local oscillator 3 is converted in a Schmitt trigger 8 to a counter pulse train and is applied to a NAND gate 9 which permits the counter pulses to reach a first counter stage Z1. These counter pulses are gated by the NAND gate 9 to the counter stage Z1 during the application of a gate pulse 11 which is supplied to the NAND gate 9 from a pulse source 10*a* via a terminal 10. The transmission or output pulses of the counter stage Z1 are applied to the counter stage Z2 as counter pulses whereby the further counter stages Z3–Z5 are respectively controlled. The counter outputs achieved in this process are decoded by a plurality of decoding stages D1–D5 respectively connected to the counter stages Z1–Z5 and are digitally indicated by means of output lines A1–A5 and respective controllable character indication tubes or similar units R1–R5 as is generally known in the art.

If a binary "0" is applied to the reset inputs of the counter stages Z1, Z2, Z3 and Z5 by way of a terminal 12, these stages are prepared for the measurement counting process. Simultaneously, however, a binary "1" is applied to the reset input 13 of the counter stage Z4 and operates to block the stage Z4. Blocking of the stage Z4 is only terminated if during the course of the pulse counting operation a prescribed number of transmission pulses P are emitted from the counter stage Z3 to a correction circuit 14 which thereupon responds with a change of its output condition to effect a resetting of the counter stage Z4 by applying a reset pulse to the input 13 through the application of a binary "0" to the reset input 13 of the counter stage Z4. The number of transmission pulses P received from the counter stage Z3 which are therefore not counted should thereby be in proportion to the amount of $f_{ZF}$ and thus to the frequency offset of the local oscillator frequency $f_u$ with respect to the receiving frequency $f_e$. The correction circuit 14 includes an input terminal 15, a plurality of binary stages 16, 17, 18, an output terminal 20, a control terminal 27 connected to a plurality of control inputs 22, 23, 24 of the respective binary stages 16, 17, 18 and a control input 19 for the binary stage 16. The input 15 of the correction circuit 14 is connected with the input of a counter stage 16 whose counting capacity corresponds either to the entire frequency offset $f_{ZF}$ or to a part of it which is defined by the expression $f_{ZF}/2^n$, whereby in the latter case $n+1$ JK flip-flops are connected one after the other in a counting chain ($n$ being an arbitrary number of 1, 2, 3 . . . and so on). In FIG. 1, one starts from the fact that the counter capacity corresponds to half of the frequency offset ($n = 1$). Therefore, two JK flip-flops 17 and 18 are provided following the counter stage 16 and are controlled by way of their counter inputs. These stages have a binary "1" applied to their J and K inputs and therefore operate their outputs Q as binary dividers. This two stage binary divider chain is fed with transmission pulses from the binary stage 16. The output Q of the binary stage 18 is connected, on the one hand, to a reset input 19 of the counter stage 16 and, on the other hand, with the output terminal 20 of the entire correction circuit 14.

When a binary "0" is applied to the terminal 12, as symbolically indicated by the switch 40, a binary "1" is applied to the reset input 22 of the binary stage 16 by way of an inverter 21 and the control input 27. Also, a binary "0" is applied to each of the reset inputs 23 and 24 of the respective binary stages 17 and 18 by way of further inverters (not illustrated). Since the output Q of the binary stage 18 also applies a binary "0" to the reset input 19 of the stage 16 in the initial condition the correction circuit is prepared for counting the transmission pulses received from the counter stage Z3. Thereby, as has already been described, the reset input 13 of the counter stage Z4 is in a blocked condition which is derived via a NAND gate 25 from the output of the inverter 21 and from the output terminal 20 of the correction circuit 14. After counting the number of transmission pulses P which is in proporiton to the frequency offset $f_{ZF}$, the output Q of the binary stage 18 is transferred into the condition of a binary "1" which, on the one hand, turns off the blocking signal of a binary "1" via the NAND gate 25 from the reset input 13 of the counter stage Z4 and, on the other hand, provides the reset input 19 of the binary stage 16 with a reset and blocking signal. In response to this operation, the blockage is removed from the counter stage Z4 and the correction circuit 14 is simultaneously blocked against responding to further pulses P which may be applied to the input 15. The counter result finally achieved is then indicated in the indication tubes R1–R5. Upon termination of the counting process, the terminal 12 is provided with a binary "1" signal which causes a resetting and blocking of the counter stages Z1, Z2, Z3 and Z5, and the flip-flops 17 and 18 as well as the counter stage Z4 via the output 20. The preparation of the entire counting circuit for the next measurement takes place again by the application of the binary "0" signal to the terminal 12. For the special case where the correction circuit 14 has not counted up to its full capacity within the total counting process provided through the duration of the gate pulses 11, a difficulty arises in the circuit according to FIG. 1 that, on the one hand, an incorrect receiving frequency $f_e$ is indicated and, on the other hand, a resetting of the counter stage 16 is not guaranteed. An incorrect indication can be avoided in a relatively simple manner in that the indication means are only operated, i.e., switched on, if the binary "1" blocking signal is switched off at the input 13 of the counter stage Z4. For this purpose, preferably a control voltage may be employed which is derived via a NAND gate from this input. For a safe resetting of the binary stage 16 it is recommended to use the circuit according to FIG. 2. With this circuit being an otherwise equal circuit structure to that illustrated in FIG. 1, the reset and blocking signal for the binary stage 16 is derived from the output signals of the inverter 21 and the NAND gate 25 via a further NAND gate 26. Therefore, the resetting of the binary stage 16 takes place through the binary "1" common reset and blocking signal applied to the terminal 12.

It is an essential advantage of the invention that the correction circuit 14 can be comprised in a simple manner into a component group which, in particular, can be connected via plug connections arranged in the circuit at the points indicated as the terminals 15, 20 and 27 between the correction circuit 14 and the remainder of the receiver circuit. In addition to this, there are only two further connections at the points 28 and 29 for feeding of the operational potentials and, in case of the exemplary embodiment illustrated in FIG. 2, a connection 30 for the feeding of a reset signal to the counter stage 16. The individual components of the correction circuit 14 can, above all, also be arranged on a plug-in type circuit board, or can be an easily separable component of an integrated semiconductor circuit. Thereby, it is of particular importance that when separating the correction circuit from the other receiving circuit the function of the latter is only influenced in that the consideration of the frequency offset $f_{ZF}$ is dropped and the local oscillator frequency $f_u$ is indicated directly.

For the second alternative of the receiving circuit according to the invention, as illustrated in FIG. 3, wherein a number of additionally created counter pulses in proportion to the frequency offset $f_{ZF}$ is directed to one or more counter stages after the occurrence of the first transmission pulse of the previous counter stage, it is advisable to employ a start-stop generator 50 of conventional design which may be self-resetting and not require the input 27 which is caused to release a prescribed number of pulses in response to the first transmission pulse of the controlling counter stage.

The circuits illustrated in FIGS. 1 and 2, or the individual parts thereof can be altered in a generally known manner so that the desired function is also maintained when employing the inverse logic signals.

Other changes and modifications of my invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A superheterodyne receiver which provides a digital indication of the receiving frequency by correcting the count of the local oscillator frequency to reflect the frequency offset of the local oscillator frequency with respect to the receiving frequency, said receiver comprising: a local oscillator; a multi-stage counter; means connecting said oscillator and said multi-stage counter and deriving a pulse train from the oscillations of said oscillator for operating said counter; means connected to said multi-stage counter for decoding and displaying the count thereof; and a correction circuit connected to first and second stages of any two adjacent stages of said multi-stage counter and operable from the output of said first stage to block said second stage for a predetermined number of output pulses from the first stage which is proportional to the frequency offset and unblock said second stage in response to detection of said predetermined number of pulses.

2. A superheterodyne receiver according to claim 1, comprising a plurality of said correction circuits and wherein each of said correction circuits and the remainder of said receiver comprise cooperable plug-in connection links for easy replacement of a correction circuit.

3. A superheterodyne receiver according to claim 2, wherein said decoding and display means is connected to said multi-stage counter and is operable to display a count corresponding to said local oscillator frequency upon disconnection of said correction circuit.

4. A superheterodyne receiver according to claim 1, wherein said correction circuit includes a counting circuit connected to said first stage and having a counting capacity corresponding at least to a part of the frequency offset, a binary frequency divider connected to said counting circuit and connected to supply blocking and reset signals to said second stage of said multi-stage counter.

5. A superheterodyne receiver according to claim 4, comprising control means for applying a common reset and blocking signal to the stages of said multi-stage counter on each side of said second stage, gate means having a first input connected to said control means and a second input connected to the output of said frequency divider, a first output connected to said second stage of said multi-stage counter to provide blocking and reset signals, and a second output connected to said counting circuit and to said frequency divider to provide presetting thereof.

6. A superheterodyne receiver according to claim 5, comprising means for deriving a reset and blocking signal for said counting circuit including a gate having first and second inputs connected to respective ones of said first and second outputs of said gate means and an output connected to said counting circuit.

7. A superheterodyne receiver which provides a digital indication of the receiving frequency by correcting the count of the local oscillator frequency to reflect the frequency offset of the local oscillator frequency with respect to the receiving frequency, said receiver comprising: a local oscillator; a multi-stage counter; means connecting said oscillator and said multi-stage counter and deriving a pulse train from the oscillations of said oscillator for operating said counter; means connected to said multi-stage counter for decoding and displaying the count thereof; and a correction circuit connected to first and second stages of any two adjacent stages of said multi-stage counter and operable in response to the occurrence of the first output pulse of said first stage to provide a number of counting pulses which is proportional to the frequency offset to subsequent stages of said multi-stage counter.

8. A superheterodyne receiver according to claim 7, wherein said correction circuit includes a start-stop generator which is operated to produce said number of pulses in response to said first output pulse of said first stage of said multi-stage counter.

* * * * *